United States Patent [19]

Matsubayashi

[11] Patent Number: 4,918,444
[45] Date of Patent: Apr. 17, 1990

[54] KEY-DEPRESSION DATA INPUT DEVICE

[75] Inventor: Norio Matsubayashi, Kawasaki, Japan

[73] Assignee: Fujitsu Limited, Kawasaki, Japan

[21] Appl. No.: 169,889

[22] Filed: Mar. 18, 1988

[30] Foreign Application Priority Data

Mar. 19, 1987 [JP] Japan .................. 62-65309

[51] Int. Cl.⁴ .......................................... H03M 11/00
[52] U.S. Cl. ........................................ 341/25; 341/26; 340/825.79; 371/59
[58] Field of Search ................ 341/24, 25, 26, 27; 340/825.79; 400/477, 479, 479.1, 479.2; 371/59; 178/176; 307/542.1; 379/368

[56] References Cited

U.S. PATENT DOCUMENTS

| | | | |
|---|---|---|---|
| 4,106,011 | 8/1978 | Melanson et al. | 341/26 |
| 4,231,016 | 10/1980 | Ueda | 340/825.79 |
| 4,420,744 | 12/1983 | Jesson | 341/25 |
| 4,661,957 | 4/1987 | Okuhara | 341/24 |
| 4,821,033 | 4/1989 | Mori et al. | 341/24 |

FOREIGN PATENT DOCUMENTS

63-149717 6/1988 Japan .

Primary Examiner—Donald J. Yusko
Assistant Examiner—Tyrone Queen
Attorney, Agent, or Firm—Staas & Halsey

[57] ABSTRACT

A key-depression data input device for detecting a depressed key in a plurality of keys arranged in a key matrix, the device including phantom key detection unit for detecting an occurrence of phantom key state, and key release checking circuit for checking a released key among depressed keys, the releasing of the released key causing a cancellation of the phantom key state. Code data corresponding to the depressed keys being generated and delivered when the key release checking circuit detects that the released key is the key satisfying a predetermined depression-release sequence condition and an error warning being delivered when the key release checking circuit detects that the released key is not the key satisfying the predetermined depression-release sequence condition.

7 Claims, 9 Drawing Sheets

KEY-DEPRESSION DATA INPUT DEVICE

BACKGROUND OF THE INVENTION

1. Field of the Invention

The present invention relates to a key data input device, and more particularly, to a key-depression data input device such as a keyboard switch for use in a word processor, a personal computer, a terminal or other keyboard device.

2. Description of the Related Arts

In general, a key depression input device is constituted by rows of Y-direction conductor lines arranged in parallel and columns of X-direction conductor lines, these rows and columns forming a matrix, and key depression switches arranged at intersections of the Y-directions and X-direction conductor lines.

In the operation of the key-depression input device, the switches are scanned to determine the states thereof, and based on the result of the scanning, the data is input by the key depression input device.

In such a key-depression input device, when a plurality of keys are simultaneously or successively depressed, a by-pass conduction route may be formed to cause an intersection of an X line and a Y line which is not closed to appear to be closed. Such an apparently closed switch is called a phantom key' or phantom switch.

Accordingly, a clock pulse is produced to detect the depression of keys and the repetition rate of the clock pulse is considerably shorter, under existing circumstances, than the time interval when the key is continuously depressed.

In a prior art, the keyboard is designed so that a plurality of keys cannot be depressed at the same time or continuously. Namely, when it is detected that a number of keys were depressed at the same time as mentioned above, this depression of the keys is considered invalid.

In order to improve the operability of the keyboard, a plurality of keys must be utilized efficiently, and in the case of a simultaneous depression of keys the case when a by-pass gives rise to a phantom depression keying must be distinguished from a case when this does not occur. The most simple and accurate means for handling a simultaneous depression of a plurality of keys is to provide diodes connected in series at each key contact.

When a diode connected in series is provided at each key contact, a phantom key depression state is usually avoided. Therefore, when three keys are depressed in sequence, the data for each key is produced, but since the number of diodes must be equal the number of key contacts, the volume of a switch board must be enlarged and the production line process more complicated, which leads to cost increases.

In the prior arts, it has been proposed, for example, that, in a key-depression input device, the rows and columns be scanned to detect the status of each switch, the detected information be stored in a storage, occurrences of the phantom switch condition in the switch array be determined, the status of the switches involved in the phantom switch condition be reversed, and after the termination of the phantom condition the key data be output.

However, in such a prior art key-depression input device the output of key data is fundamentally based on the existence/non-existence of the phantom switch condition, and an operation for detecting a key release manner, from the viewpoint of the key depression-release order among the keys involved in the phantom key condition, is not carried out. Therefore, the speed of output of the key data is limited, and is below a desired level, in such a prior art key-depression input device.

SUMMARY OF THE INVENTION

An object of the present invention is to provide an improved key-depression input device in which the order of depression-release of a releasing key is checked, only true key input errors are detected, and apparent key input errors are not detected, and the detection of key input errors is carried out in such a manner that delays in the key input operation are minimized.

Another object of the present invention is to restrict the sounding of an alarm to only the cases wherein true key input errors occur, without slowing the speed of the key operation by the operator, and accordingly, to release a correct and rapid key input operation.

DESCRIPTION OF THE PREFERRED EMBODIMENTS

Figure 1:
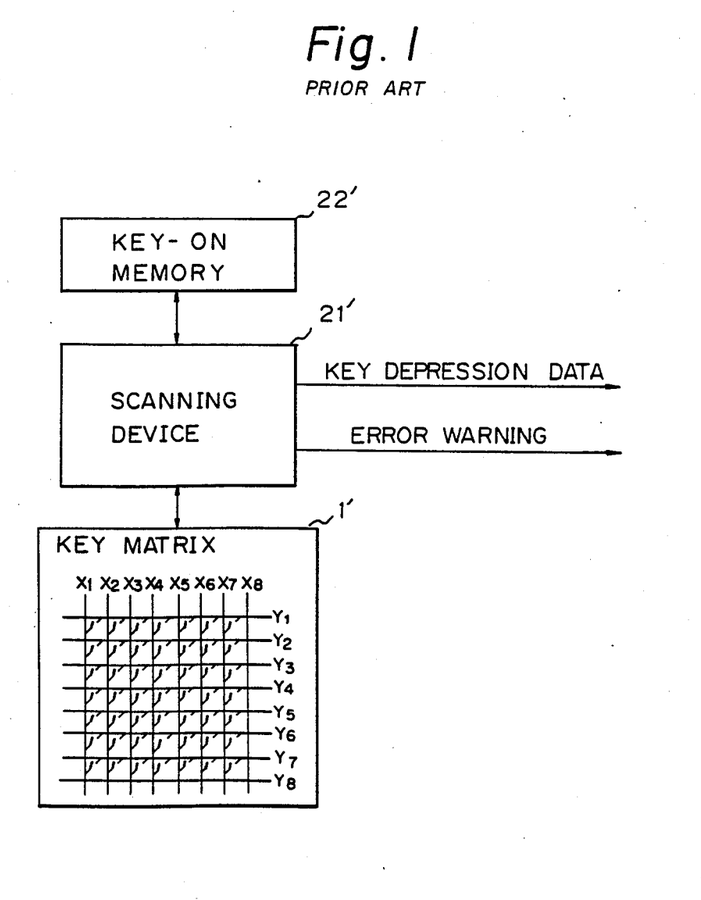
FIG. 1 schematically illustrates a prior art key-depression input device.

Before describing the preferred embodiments, an example of a prior art key-depression input device is explained with reference to FIGS. 1, 2, and 3. In a prior art key-depression input device shown in FIG. 1, the keyboard itself is represented as a matrix $1'$, which consists of electrical conduction lines arranged in columns $X_1, X_2, \ldots X_6$ and rows $Y_1, Y_2, \ldots Y_6$, forming intersections therebetween. When a key is not depressed the corresponding contact at an intersection is open, and when a key is depressed, the corresponding contact at an intersection is closed.

The states of the switches of the key matrix $1'$ are scanned and the data obtained is processed in a scanning device $21'$ in collaboration with a key-on memory $22'$. As the result of the processing in the scanning device $21'$, the scanning device $21'$ outputs key-depression data and, where a phantom status is detected, a phantom status alarm signal (i.e. "an error warning" as shown in FIG. 1).

A phantom key state is explained with reference to FIG. 2. The keyboard has column conductor lines $X_1$, $X_2, X_3, \ldots$, and row conductor lines $Y_1, Y_2, Y_3, \ldots$, arranged in a matrix. The key contacts of key switches SW11, SW12, SW21, and SW22 are arranged at the intersections of the conductor lines.

Figure 2:
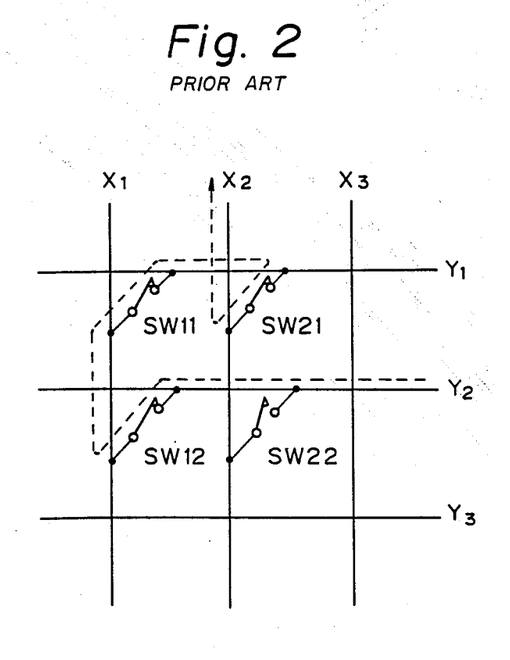
FIG. 2 illustrates a phantom switch state.

In the arrangement shown in FIG. 2, when a plurality of contacts are depressed simultaneously or continuously, a sneak-conduction or a bypass phenomenon occurs, and this is difficult to remedy.

For example, assume that the keys SW11, SW12, and SW21 are depressed. By applying potentials to the column lines X1 and X2 and to the row line Y1, the closing of the keys SW11 and SW21 is detected, and by applying potentials to the column line X1 and to the row line Y2, the closing of the key SW12 is detected.

When potentials are applied to the row line Y2 and to the column lines X1 and Y1, a conduction route Y2-SW12-X1-SW11-SW21-X2 indicated by a broken line is formed so that a connection between the row lines Y2 and the column line X2 is apparently detected. Such an apparently detected connection between the line Y2 and the line X2 represents a state in which it appears that the key SW22 at the intersection between line Y2 and line X2 has been depressed, although the key SW22 is not actually depressed. Such a key SW22 depressed in this manner is called a "phantom key" or "phantom switch".

Figure 3:
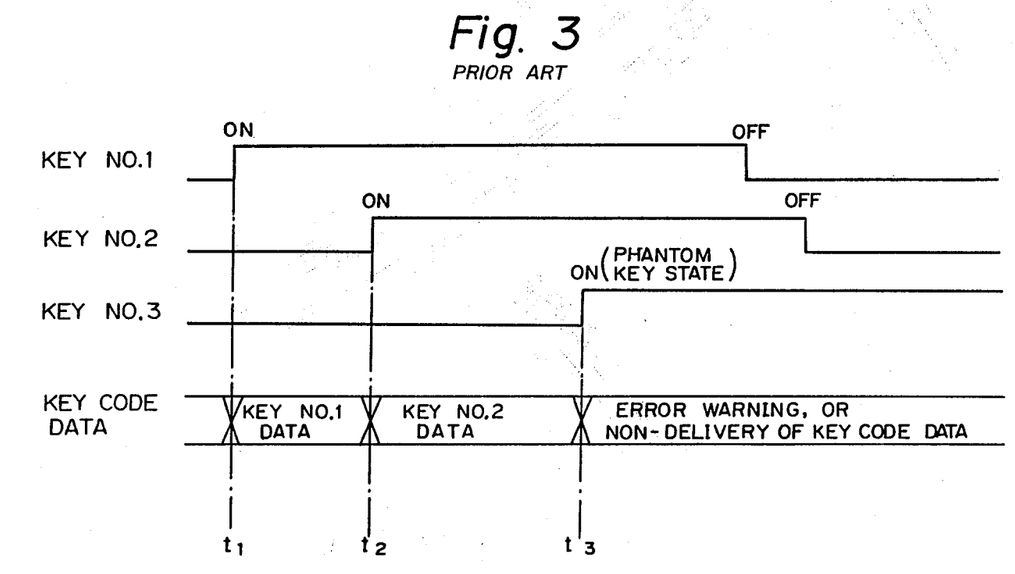
FIG. 3 shows the characteristic of the operation of the device of FIG. 1.

The operation of a prior art key depression input device in connection with key Nos. 1, 2, and 3 which can cause a phantom key status is illustrated in FIG. 3. It is assumed that key Nos. 1, 2, and 3 and are successively depressed at time $t_1$, $t_2$, and $t_3$, and a phantom status is formed at time $t_3$ when key No. 3 is depressed. In this case, the operator may be warned of the occurrence of an error or the output of key code data corresponding to key No. 3 prevented.

However, this detection of an error simply because of successive depressions of key Nos. 1, 2, and 3 is not conducive to an efficient operation of the key depression input device by the operator. One reason for this is that, the error decision is made too quickly immediately after the depression of key No. 3, and the operation of the device does not wait for the very short time needed for cancellation of the phantom key status by, for example, the release of key No. 1 soon after the depression of key No. 3.

Figure 4:
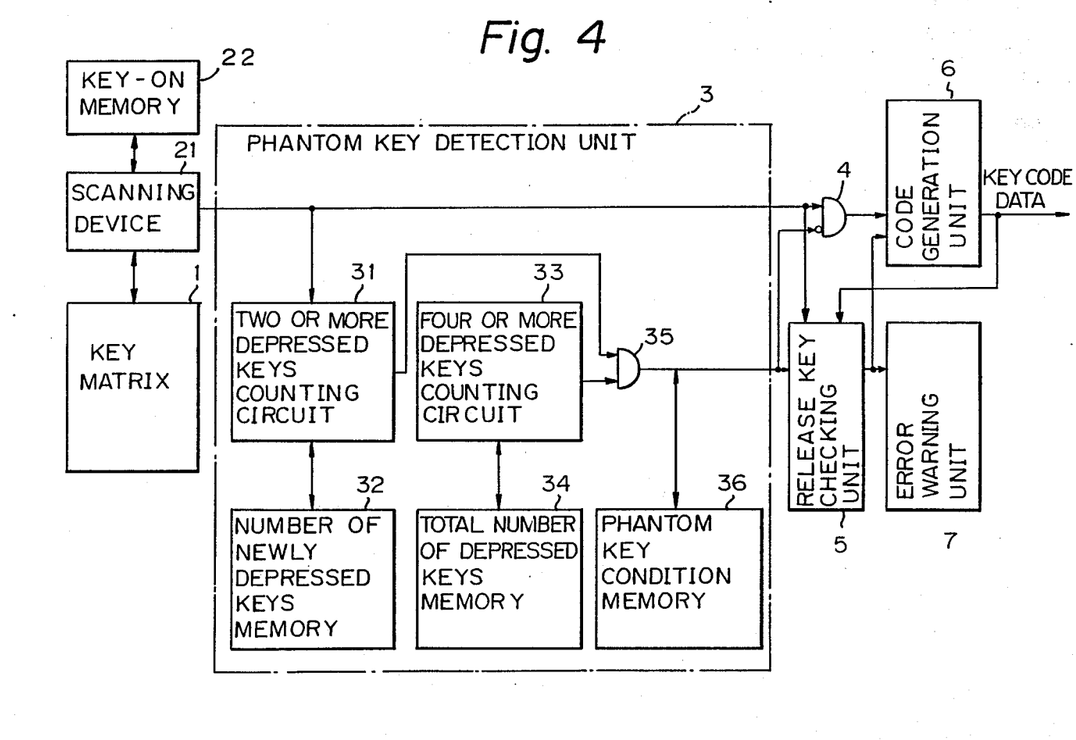
FIG. 4 shows a key-depression data input device according to an embodiment of the present invention.

A key depression data input device according to an embodiment of the present invention is shown in FIG. 4. In the device of FIG. 4, reference numeral 1 denotes a key matrix in which key contacts are arranged in a matrix-like form, 22 a key-on memory, 21 a scanning device which periodically scans the key matrix and determines whether or not a key or keys has or have been depressed. Numeral 3 denotes a phantom key detection means, 5 is a release key checking means which whereby, when the phantom keying condition is not realized by releasing a predetermined key among the depressed keys, the check is carried out at the released key, 6 is a code data generation means and 7 is an error warning means.

An embodiment of the present invention shown in FIG. 4 includes detecting means for detecting the generation of a phantom keying condition checking means for checking that a released key among the depressed keys has released the phantom keying condition code generation means for generating normal code data when the released key checked by the checking means corresponds to a key in which a normal depression has been detected.

The device of FIG. 4 drives the detecting means, checking means, and code generation means, and further, operates the intercept means for informing the operator of the generation of an error when the released key has not been in a normal state.

Note, the operation of the phantom key detection unit is described in detail in the Japanese Patent Publication No. 63-149717.

The operation of the device of FIG. 4 will be explained with reference to FIG. 5.

Reference numeral 31 denotes a first counting circuit for producing an output, when more than two newly detected keys are counted during one scan, 33 denotes a second counting circuit for producing an output when a total number of depressed keys is more than four, and 35 denotes an AND circuit. The number of depressed keys is counted by the first counter 31. During a time from when the first key has been depressed to a time when the entire key matrix is scanned, when the number of depressed keys is "1", and at the same time, the total number of keys depressed is counted by a second counter 33, and the value of the total number depressed keys counted during depression is also "1", then when the depression of the key is not continued, the code data corresponding to the detected key is output by a code data generation portion (not shown in FIG. 4). Every time a new key is depressed, the counters 31 and 33 begin to count. When a third key is depressed, caused the generation of a phantom key, since the counter 31 also counts the phantom key, the counted value becomes "2" and an output is produced. Since the total number of depressed keys is now "4", the second counter 33 also produces an output. When the outputs are produced together from counters 1 and 33, the output of an AND circuit 35 is HIGH and as a result, it is considered that the generation of a phantom key has been detected, and the output of the key matrix scanning device 21 to the code generation member 6 is stopped by an AND circuit 4.

Figure 5:
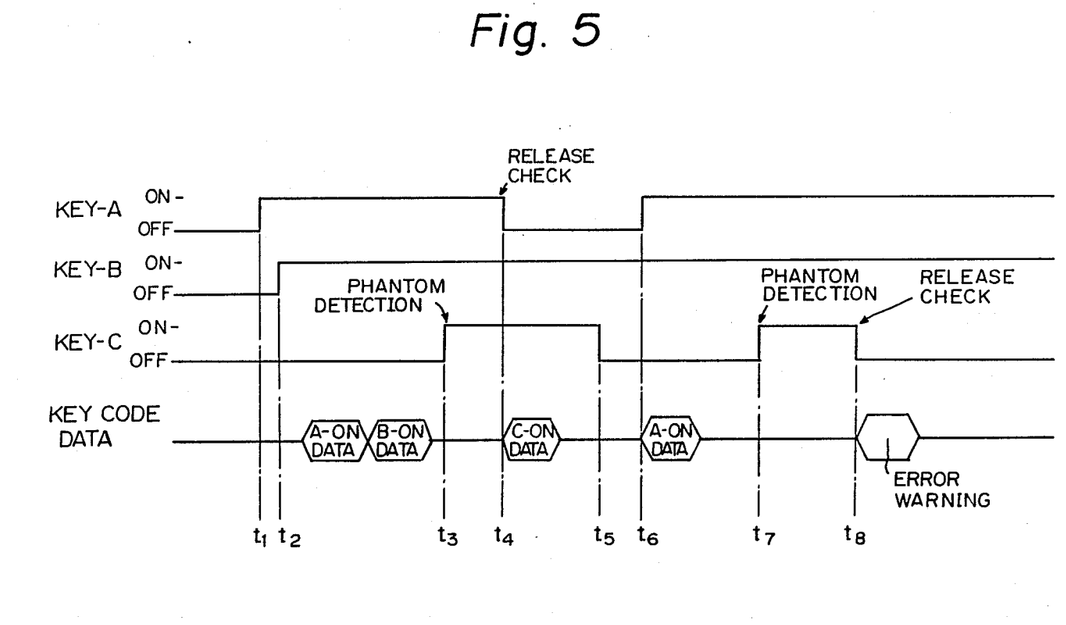
FIG. 5 illustrates the operation of the device of FIG. 4.

This state is the state at time $t_3$ in FIG. 5, whereby only a code data corresponding to the depressed key B is produced from the code generation means 6. When key-A is turned off at time $t_4$, the gate 4 sends a voltage variation signal to the release key checking circuit 5, and a check is made to determine which of the keys has been released. The output of the code generation member 6 with respect to the keys is tested, and the order of the depression and release of the keys is checked. When the key in question is key-C the code data of which has not been produced, and the earlier closed key-A is earlier released, showing the establishment of the normal depression-release order of key operation, a code data for key-C is produced from the code generation member 6.

When a key C is turned OFF at time $t_5$, the output of AND circuit 35 is not changed. When a key A is turned ON at time $t_6$, the code generation member 6 produces code data for the key A. When the key C is again turned ON at time $t_7$, the output of the AND circuit 35 is changed to prevent the generation of a new code. When the key C is turned OFF at time $t_8$, the release key checking member 60 checks the released key on the basis of the output of the gate 35. If it is acknowledged that key-C, the code data of which has not yet been delivered, is turned OFF, it is determined that the order of the normal depression-release has been reversed, and the release key checking circuit 5 drives the error warning circuit 7 to produce an error warning.

Figure 6:
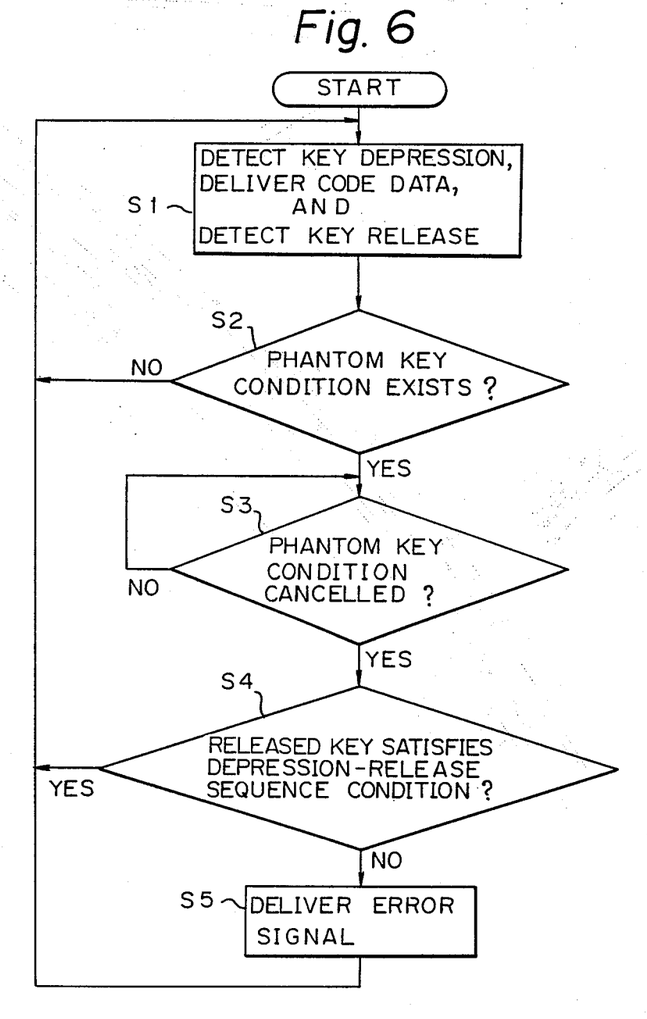
FIG. 6 is a flow chart of the general processes of the operation of the device of FIG. 4.

FIG. 6 is a flow chart showing the operation of the device. After the process of a scanning device 21 is started, a key depression is detected in step S1 and code data produced. Then, in step S2, it is determined whether or not a phantom key condition exists. When a phantom key condition does not exist, the process returns to step S1 and stands by for the next key depression. When a phantom key condition does exist, the device detects in step S3 whether the phantom key condition has been released. The process then waits until the phantom key condition has been cancelled, and then proceeds to step S4 to check the state of the released key be determining whether or not code data has been generated. When code data has not been generated, an error signal is produced and output in step S5.

Figures 7, 7A:
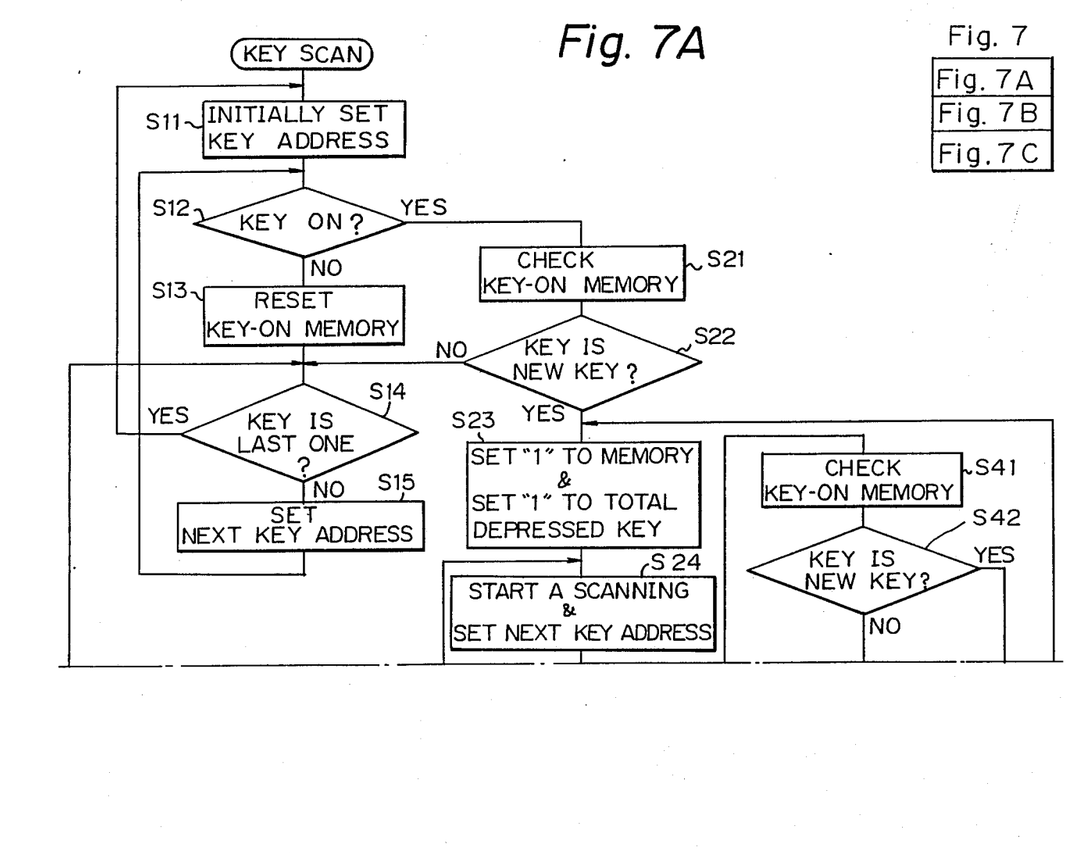
FIGS. 7A, 7B and 7C collectively comprise a flow chart of the detailed processed of the operation of the device of FIG. 4.
Figure 7B:
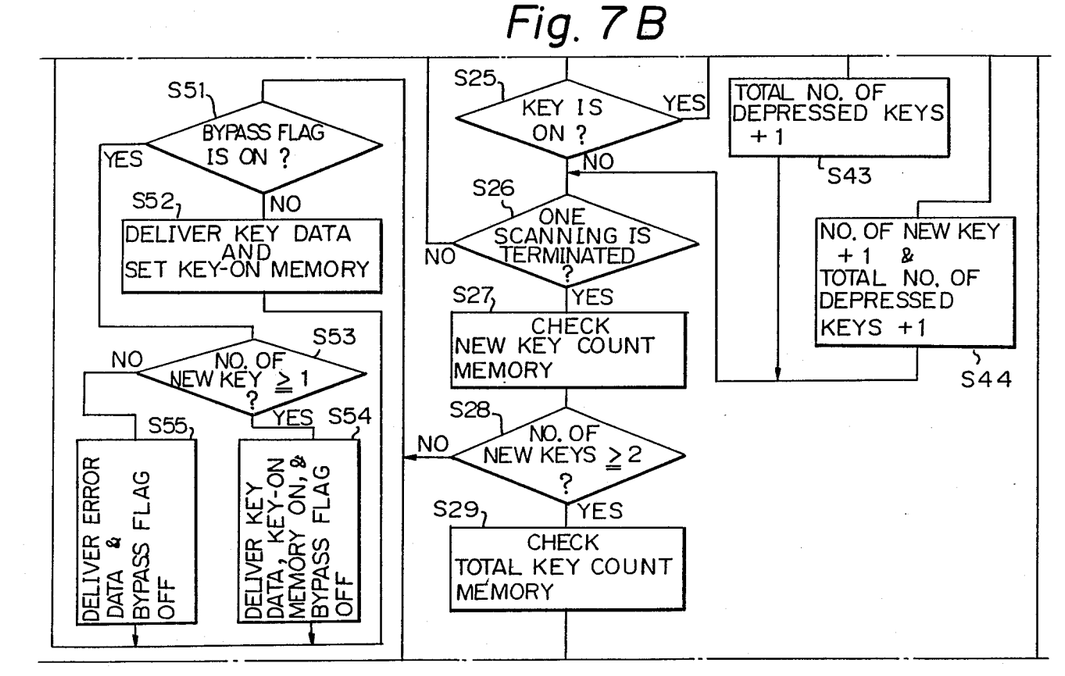
Figure 7C:
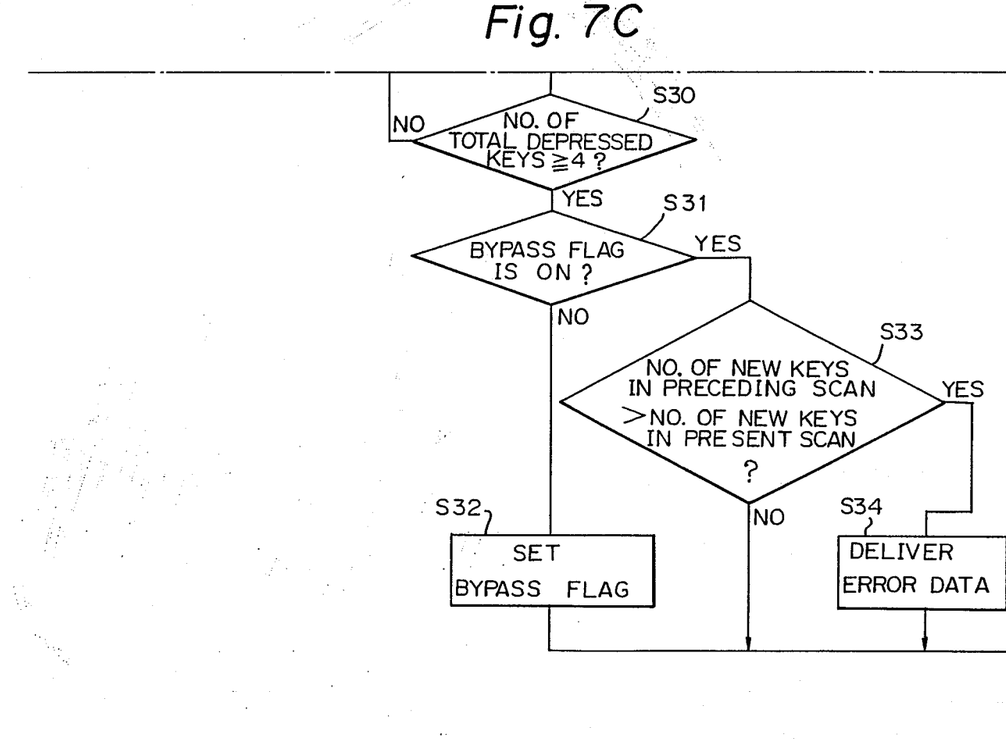

FIGS. 7A, 7B and 7C collectively comprise a flow chart showing in detail the operation of the device according to the present invention.

After a key scan is carried out, a key address is initially set in step S11 and the crosspoint of each key is identified. In step S12, it is determined whether or not the key is ON, and if not, a key-ON memory is reset in step S13. Then, in step S14, it is determined whether or not the key is the last key. When NO, the step proceeds to the step S15 and the next key address is set. When YES, the process returns to step S11, and the signal output at S15 is sent to step S12.

In Step S12, when YES, then in step S21 a key-ON memory is checked, and in step S22, it is determined whether the key is a newly depressed key. When YES, in step S23, "1" is set into the memory 1 of the new key and the total number of depressed keys is set into the memory. Then, in step S24, a scanning is started and a next key address is set, where a scanning is commenced from No. 6 key.

Then, in step S25, it is determined whether the key is ON, and in step S26, it is determined whether the one scanning is terminated. When YES, the process returns to step S24.

In step S27, the new key count memory is checked, and in step S28, it is determined whether the total number of new keys is equal to or larger than 2. When YES, the total key count memory is checked in step S29, and then in step S30, it is determined whether the number of the total number of keys is equal to or larger than four. Then, in step S31, it is determined whether a bypass or detour flag is ON, and when NO, a by-pass flag is set in step S32. When YES, in step S31, it is determined at step S33 whether the total number of new keys in the ceding scan is larger than the total number of new keys in the present scan. When YES, error data is delivered in step S34 and the process returns to step S23.

In step S30 when the result is NO, the process goes to step S51 and it is determined whether the detour flag is ON. Then, in step S52. key data is sent and a key-on memory is set.

When YES, at step S51, it is determined whether or not a newly depressed key exists, i.e., the total number of newly depressed keys is equal to or larger than 1, and when NO, in step S55, error data is delivered and a detour flag is made OFF. Conversely, when YES, in step S53, key data is delivered, the key-on memory is made ON, and the detour flag is made OFF.

When NO, in step S53, a newly depressed key (key data is not get delivered) is released to cancel a detour, i.e., the phantom switching condition is cancelled.

When YES is step S53, the key for delivering the key data is released to cancel a detour or the phantom switching condition.

I claim:

1. A key-depression data input device for detecting a depressed key in a plurality of keys arranged in a key matrix, said device comprising:

phantom key detection means for detecting an occurrence of a phantom key state;

key release checking means for checking a released key among depressed keys, the releasing of said released key causing a cancellation of the phantom key state;

means for generating code data corresponding to the depressed keys when said key release checking means detects that said released key is the key satisfying a predetermined depression-release sequence condition; and means for producing an error warning when said key release checking means detects that said released key is not the key satisfying the predetermined depression-release sequence condition.

2. A device according to claim 1, wherein said phantom key detection means comprises means for detecting that two or more keys including a phantom key have been newly depressed in a single scanning of said key matrix and the total number of keys depressed in said single scanning is four or more.

3. A device according to claim 1, wherein said phantom key detection means comprises a newly depressed key number counting circuit for determining the existence of two or more depressed keys, a depressed key total number counting circuit for determining the existence of four or more depressed keys, a first AND gate for receiving the outputs of said newly depressed key number counting circuit and said depressed key total number counting circuit, and memories corresponding to said newly depressed key number counting circuit, said depressed key total number counting circuit, and said AND gate.

4. A device according to claim 3, wherein a second AND gate is provided for receiving a signal from a scanning device and the inversion signal of the output of said first AND gate of said phantom key detection means and carrying out an AND operation thereon.

5. A device according to claim 4, wherein said code generating means receives the outputs of said key release checking means and said second AND gate.

6. A device according to claim 3, wherein said key release checking means receives the output of said first AND gate of said phantom key detection means, a signal from a scanning device, and a signal from said code generation means and produces an output signal, the output signal being supplied to said code generation means and error warning means.

7. A device according to claim 5, wherein said key release checking means receives the output of said first AND gate of said phantom key detection means, a signal from a scanning device, and a signal from said code generation means and produces an output signal, the output signal being supplied to said code generation means and error warning means.

* * * * *

UNITED STATES PATENT AND TRADEMARK OFFICE
CERTIFICATE OF CORRECTION

PATENT NO. : 4,918,444

DATED : April 17, 1990

INVENTOR(S) : Norio MATSUBAYASHI

It is certified that error appears in the above-identified patent and that said Letters Patent is hereby corrected as shown below:

Col. 1, line 53, after "equal" insert --to--.

Col. 2, line 38, "processed" should be --processes--.

Col. 3, line 14, "lines" should be --line--.

Col. 4, line 25, "caused" should be --causing--;
line 31, "counters 1" should be --counters 31--.

Col. 5, line 10, "be" should be --by--;
line 46, "ceding" should be --preceding";
line 62, delete "get".

Signed and Sealed this

Seventeenth Day of September, 1991

Attest:

HARRY F. MANBECK, JR.

Attesting Officer

Commissioner of Patents and Trademarks